(12) United States Patent
Schmidt

(10) Patent No.: US 8,380,453 B2
(45) Date of Patent: Feb. 19, 2013

(54) METHOD AND DEVICE FOR DETERMINING THE FREQUENCY DISTRIBUTION OF THE SIGNAL LEVELS OF A MEASURED SIGNAL MEASURED IN OVERLAPPING OBSERVATION INTERVALS

(75) Inventor: Kurt Schmidt, Grafing (DE)

(73) Assignee: Rohde & Schwarz GmbH & Co. KG, Munich (DE)

( * ) Notice: Subject to any disclaimer, the term of this patent is extended or adjusted under 35 U.S.C. 154(b) by 410 days.

(21) Appl. No.: 12/446,531

(22) PCT Filed: Sep. 6, 2007

(86) PCT No.: PCT/EP2007/007791
§ 371 (c)(1),
(2), (4) Date: Apr. 21, 2009

(87) PCT Pub. No.: WO2008/049482
PCT Pub. Date: May 2, 2008

(65) Prior Publication Data
US 2010/0305894 A1    Dec. 2, 2010

(30) Foreign Application Priority Data

Oct. 26, 2006  (DE) .......................... 10 2006 050 616

(51) Int. Cl.
| G01R 23/16 | (2006.01) |
| G06F 13/00 | (2006.01) |
| G11C 7/00 | (2006.01) |
| G11C 29/00 | (2006.01) |

(52) U.S. Cl. ........... 702/76; 345/537; 365/194; 714/722

(58) Field of Classification Search .................... 702/76, 702/66–67, 69–73, 75, 79–81, 84–85, 89, 702/127, 179, 182–183, 189–190; 345/534, 345/537, 541, 545; 365/189.011, 189.07, 365/190–191, 194; 714/1, 6.1, 25, 46, 54, 714/718, 722, 798–799
See application file for complete search history.

(56) References Cited

U.S. PATENT DOCUMENTS 5,448,508 A     9/1995  Ono et al.
6,137,810 A *  10/2000  Bjurel et al. .................. 370/509

FOREIGN PATENT DOCUMENTS

DE           283202 A5    10/1990
DE         10004327 A1     9/2000
(Continued)

OTHER PUBLICATIONS

Yavuz et al., Statistical Image Reconstruction Methods for Randoms-Precorrected PET Scans, 1998, Medical Image Analysis, vol. 2, No. 4, 9 pp.*
"Recursion in Short-Time Signal Analysis," Michael Unser, Sep. 27, 1982, pp. 1-12.
WO 2004/063939 A3, International Search Report, Jul. 26, 2005, pp. 1-12.

(Continued)

*Primary Examiner* — Toan Le
(74) *Attorney, Agent, or Firm* — Ditthavong Mori & Steiner, P.C.

(57) ABSTRACT

A method for determining the frequency distribution of the signal level of a measured signal measured respectively in overlapping observation intervals via a time or frequency raster. The method includes determining the incrementation of a memory cell in a first memory to be implemented for each measured signal level of the measured signal at a value of the time or frequency raster, and un-delayed summation of the incrementation determined for every memory cell of the first memory in every measurement cycle. The method also includes delayed summation of the incrementation determined for every memory cell of the first memory in every measurement cycle, and subtracting the result of the delayed summation of the incrementation determined for every memory cell of the first memory in every measurement cycle from the result of the un-delayed summation of the incrementation determined for every memory cell of the first memory in every measurement cycle.

8 Claims, 3 Drawing Sheets

FOREIGN PATENT DOCUMENTS

| | | |
|---|---|---|
| DE | 10105256 A1 | 8/2002 |
| DE | 102004019967 A1 | 11/2005 |
| EP | 0710926 A2 | 5/1996 |
| WO | 2004063939 A2 | 7/2004 |

OTHER PUBLICATIONS

International Preliminary Report on Patentability, PCT/EP2007/007791, May 14, 2009, pp. 1-12.

* cited by examiner

| i | Second memory: | Third memory: | First memory: |
|---|---|---|---|
| 0 | 00 00 00 00 00<br>00 00 00 00 00<br>00 00 00 00 00<br>00 00 00 00 00 | 00 00 00 00 00<br>00 00 00 00 00<br>00 00 00 00 00<br>00 00 00 00 00 | 00 00 00 00 00<br>00 00 00 00 00<br>00 00 00 00 00<br>00 00 00 00 00 |
| 1 | 00 00 00 00 00<br>00 01 00 01 00<br>00 01 01 01 00<br>01 01 01 01 01 | 00 00 00 00 00<br>00 00 00 00 00<br>00 00 00 00 00<br>00 00 00 00 00 | 00 00 00 00 00<br>00 01 00 01 00<br>00 01 01 01 00<br>01 01 01 01 01 |
| 2 | 00 00 00 00 00<br>00 01 00 01 00<br>00 10 10 01 00<br>10 10 10 01 10 | 00 00 00 00 00<br>00 00 00 00 00<br>00 00 00 00 00<br>00 00 00 00 00 | 00 00 00 00 00<br>00 01 00 01 00<br>00 10 10 01 00<br>10 10 10 01 10 |
| 3 | 00 00 00 00 00<br>00 10 00 10 00<br>01 11 11 10 00<br>11 11 11 10 11 | 00 00 00 00 00<br>00 00 00 00 00<br>00 00 00 00 00<br>00 00 00 00 00 | 00 00 00 00 00<br>00 10 00 10 00<br>01 11 11 10 00<br>11 11 11 10 11 |
| 4 | 00 00 00 00 00<br>00 11 00 11 00<br>01 00 11 11 00<br>00 00 00 11 11 | 00 00 00 00 00<br>00 01 00 01 00<br>00 01 01 01 00<br>01 01 01 01 01 | 00 00 00 00 00<br>00 10 00 10 00<br>01 11 10 10 00<br>11 11 11 10 10 |
| 5 | 00 00 00 00 00<br>00 00 00 00 00<br>01 01 00 00 01<br>01 01 01 00 00 | 00 00 00 00 00<br>00 01 00 01 00<br>00 10 10 01 00<br>10 10 10 01 10 | 00 00 00 00 00<br>00 11 00 11 00<br>01 11 11 11 01<br>11 11 11 11 10 |
| 6 | 00 00 00 00 00<br>00 00 00 01 00<br>01 10 01 01 01<br>10 10 10 01 01 | 00 00 00 00 00<br>00 10 00 10 00<br>01 11 11 10 00<br>11 11 11 10 11 | 00 00 00 00 00<br>00 10 00 11 00<br>00 11 10 11 01<br>11 11 11 11 10 |
| 7 | 00 00 00 00 00<br>00 01 00 10 00<br>01 11 10 10 01<br>11 11 11 10 10 | 00 00 00 00 00<br>00 11 00 11 00<br>01 00 11 11 00<br>00 00 00 11 11 | 00 00 00 00 00<br>00 10 00 11 00<br>00 11 11 11 01<br>11 11 11 11 11 |
| | ⋮ | ⋮ | ⋮ |

METHOD AND DEVICE FOR DETERMINING THE FREQUENCY DISTRIBUTION OF THE SIGNAL LEVELS OF A MEASURED SIGNAL MEASURED IN OVERLAPPING OBSERVATION INTERVALS

CROSS-REFERENCE TO RELATED APPLICATION

The present application claims priority to PCT Application No. PCT/EP2007/007791, filed on Sep. 6, 2007, and German Patent Application No. 10 2006 050 616.2, filed on Oct. 26, 2006, the entire contents of which are herein incorporated by reference.

BACKGROUND OF THE INVENTION

1. Field of the Invention

The invention relates to a method and a device for determining the frequency distribution of the signal levels of a measured signal measured respectively in overlapping observation intervals.

2. Discussion of the Background

A device for recording and storing a measured signal is known, for example, from DE 10 2004 019 967 A1.

Cyclical measurements of signals in the time or frequency domain are implemented either in overlapping observation intervals or in non-overlapping observation intervals. By comparison with a measurement in overlapping observation intervals, a measurement in non-overlapping observation intervals provides a comparatively-low correlation, which leads to significant fluctuations in the signal levels of the measured signal measured in a time or frequency raster between the individual observation intervals. These fluctuations in the signal level of the measured signal over the individual observation intervals disadvantageously present the user with an unsettled display of the measured signal on the screen of the display device.

In order to avoid this kind of jitter effect in measurement technology, overlapping observation intervals are preferred, wherein each observation interval consists of an identical total number NofFrames of measurement cycles, as shown in FIG. 1, and wherein, in each case, two successive observation intervals are delayed relative to one another by a relatively-smaller number NofFramesNextCalc of measurement cycles. Since the number NofFramesNextCalc of measurement cycles between two observation intervals delayed relative to one another is significantly smaller than the total number NofFrames of measurement cycles in every observation interval, the evaluation of measured data is quasi-parallel or respectively quasi-smooth. Accordingly, a plurality of observation intervals—NofFrames/NofFramesNextCalc observation intervals—must be detected and evaluated in parallel, which is difficult to realize in real time even with currently-available computer performance.

SUMMARY OF THE INVENTION

Embodiments of the present invention therefore advantageously provide a method and a device for quasi-smooth detection and evaluation of signal levels of a measured signal in overlapping observation intervals as a real-time-compatible solution, which is efficient with regard to computation time.

According to an embodiment of the invention, instead of a quasi-parallel detection and evaluation of the signal levels of the measured signal in a total of NofFrames/NofFramesNextCalc observation intervals, which are delayed respectively relative to one another by NofFramesNextCalc measurement cycles, the signal levels of the measured signal are detected continuously and evaluated with reference to a predetermined raster of signal-level ranges and time or frequency values, and, at the same time, the evaluations of the signal levels of the detected, measured signal delayed in time by the number NofFrames of measurement cycles of one observation interval are subtracted from the un-delayed evaluations of the detected signal levels of the measured signal. The result of this subtraction represents the number of signal levels of the measured signal disposed in one observation interval at the individual raster points. If this subtraction is implemented within the cycle of the number NofFramesNextCalc of measurement cycles occurring in the delay time between two observation intervals following one another in time, the observation intervals delayed in time relative to one another by NofFramesNextCalc measurement cycles and the signal levels of the measured signal detected at the individual raster points are determined in each case.

Accordingly, the detection of the signal levels of the measured signal is reduced from a total of NofFrames/NofFramesNextCalc detections running in parallel to a single detection with the addition of a time delay. The evaluation of the signal levels of the measured signal—determination of the number of detected signal levels of the measured signal occurring in each case in the individual signal-level ranges and at the individual values of the time or frequency raster—is reduced from a total of NofFrames/NofFramesNextCalc evaluations running in parallel to the two evaluations (un-delayed and delayed evaluation of the detected signal levels of the measured signal) running in parallel.

For this purpose, the device according to an embodiment of the invention consists of:

a first memory, in the memory cells of which the number of signal levels of the measured signal detected in the individual observation intervals within the respective signal-level range and at the respective value of the time or frequency raster are buffered;

a second memory, in the memory cells of which the number of signal levels of the measured signal added up un-delayed in the respective signal-level range and at the respective value of the time or frequency raster in the individual measurement cycles of the individual observation intervals are buffered; and a second memory, in the memory cells of which the number of signal levels of the measured signal added up delayed in the respective signal-level range and at the respective value of the time or frequency raster in the individual measurement cycles of the individual observation intervals are buffered.

Additionally, the device according to an embodiment of the invention contains a delaying unit for delaying the signal levels of the measured signal detected in the individual signal-level ranges and at the individual values of the time or frequency raster by the number NofFrames of measurements cycles of an observation interval, and a subtraction unit for subtracting the memory contents in the individual memory cells of the third memory from the memory contents in the corresponding memory cells of the second memory and buffering the subtraction result in the corresponding memory cells of the first memory within the cycle of the number NofFramesNextCalc of measurement cycles in the delay time between two successive observation intervals.

BRIEF DESCRIPTION OF THE DRAWINGS

Exemplary embodiments of the method according to the invention and the device according to the invention for determining the frequency distribution of the signal levels of a measured signal measured respectively in overlapping observation intervals are explained in greater detail with reference to the drawings. The drawings are as follows:

FIG. 4 shows an exemplary memory definition of the first, second and third memory of the device according to the invention for determining the frequency distribution of signal levels of a measured signal measured respectively in overlapping observation intervals.

DETAILED DESCRIPTION OF EXEMPLARY EMBODIMENTS OF THE INVENTION

Figure 2:
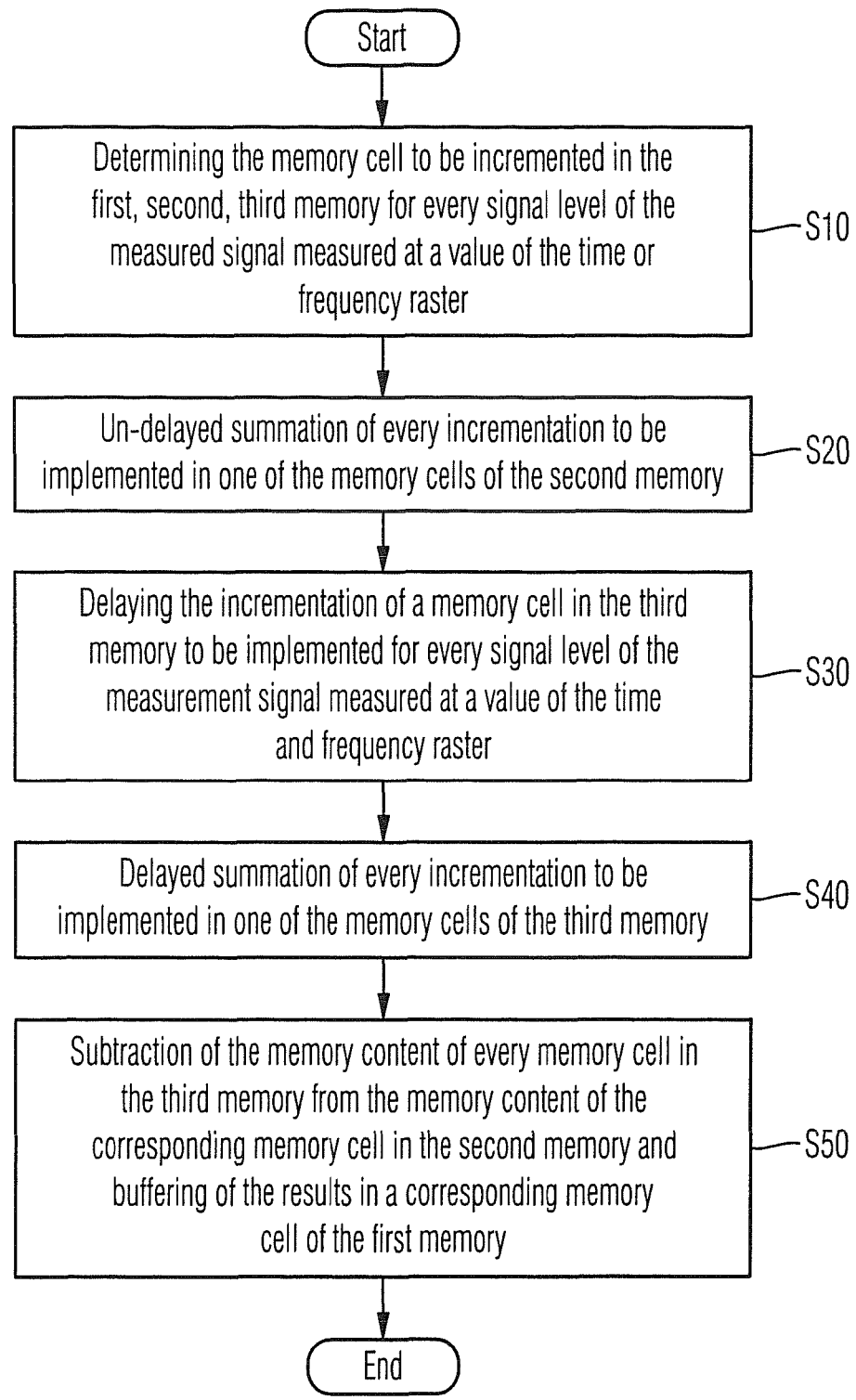
FIG. 2 shows a flow chart for an exemplary embodiment of the method according to the invention for determining the frequency distribution of signal levels of a measured signal measured respectively in overlapping observation intervals.

With reference to FIG. 2, the following section describes a method according to an embodiment of the invention for determining the frequency distribution of the signal levels of a measured signal measured respectively in overlapping observation intervals.

According to the first procedural stage S10, the signal level of the measured signal measured in each case by the detector of the measuring device or system at a given value of the time or frequency raster of the measurement is transformed at the resolution of the pixel graphic of the screen of a display device associated with the measuring device or system by determining in every measurement cycle the memory cells, which are associated with the value of the time or frequency raster of the measurement and the detected signal level of the measured signal, and which are to be incremented in each case for one measurement cycle in a column of a first memory 1 disposed upstream of the display and controlling the individual pixels of the display.

In the next procedural stage S20, the memory cells of the second memory 2 corresponding to the memory cells of the first memory 1 determined in the preceding procedural stage S10 for an incrementation are each incremented in every measurement cycle by the value "1", wherein the incrementations to be implemented in the respective memory cells of the second memory 2 are implemented in an un-delayed manner within the interval of the respective measurement cycle.

The subsequent procedural stage S30 delays the information determined in each measurement cycle in the first procedural stage S10 regarding memory cells to be incremented in the first memory 1 by a delay time, which corresponds to the number NofFrames of measurement cycles of an observation interval.

In the next procedural stage S40, the corresponding memory cells of the third memory 3 are incremented in every measurement cycle with the information regarding the memory cells to be incremented in the first memory, which were delayed in procedural stage S30 by the number NofFrames of measurement cycles of on observation interval. In this context, the respective memory cells of the third memory 3 are incremented in a delayed manner relative to the respective measurement cycle by the number NofFrames of measurement cycles of an observation interval.

Figure 1:
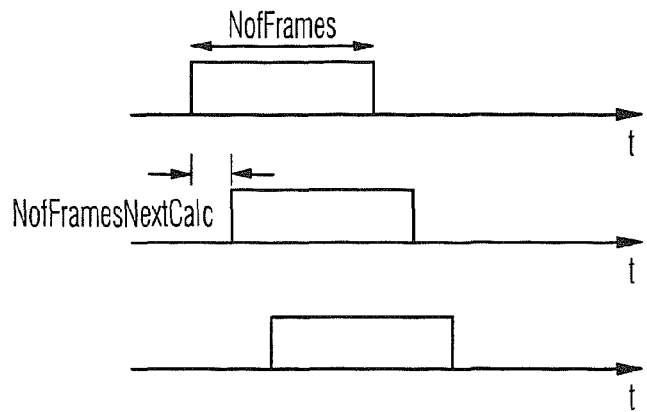
FIG. 1 shows a time-flow diagram with overlapping observation intervals.

In the concluding procedural stage S40, the memory content of every memory cell of the third memory 3 is subtracted from the memory content of the respectively corresponding memory cell of the second memory 2, and the results of the subtraction are buffered in the corresponding memory cell of the first memory 1 in each case within the raster of the number NofFramesNextCalc of measurement cycles, which occur, as shown in FIG. 1, within the delay time between two successive observation intervals.

Figure 3:
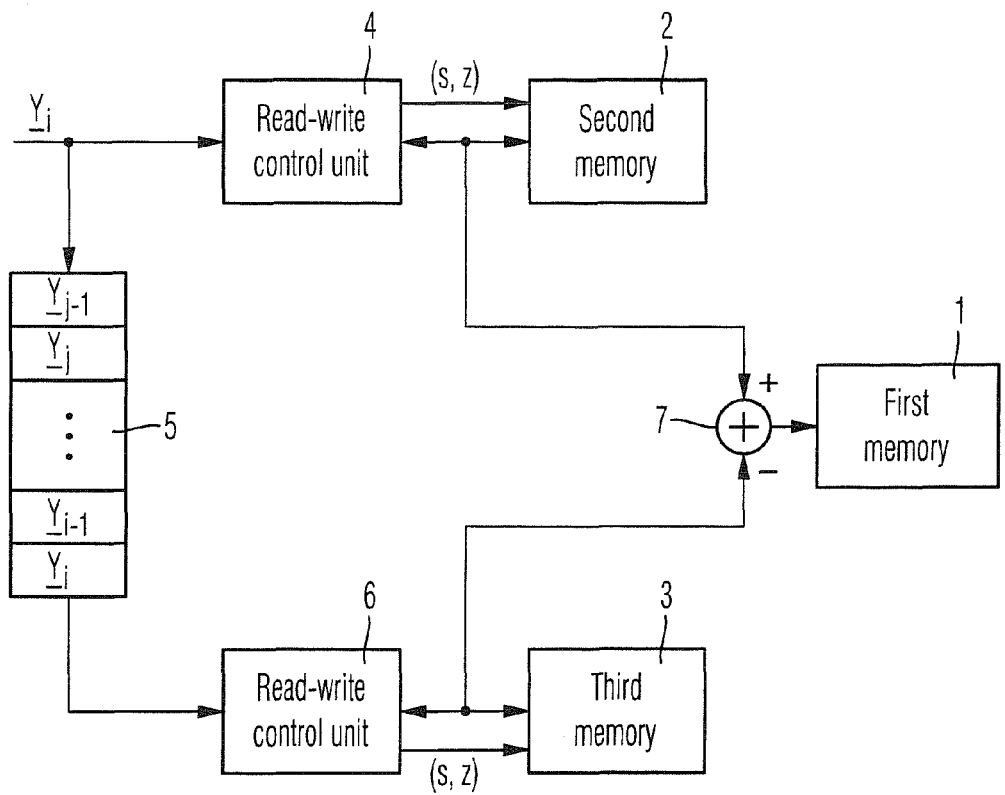
FIG. 3 shows a block-circuit diagram of an exemplary embodiment of the device according to the invention for determining the frequency distribution of signal levels of a measured signal measured respectively in overlapping observation intervals.

With reference to FIG. 3, the following section describes the device according to the invention for determining the frequency distribution of the signal levels of a measured signal measured respectively in overlapping observation intervals.

The memory cells of the first memory 1 determined in measurement cycle i, of which the memory contents are to be incremented in measurement cycle i, are buffered by a functional unit, which is not illustrated in FIG. 3, in a matrix $Y_i$ and supplied to the read-write control unit 4 in order to drive the second memory 2 and the delaying unit 5.

Dependent upon the contents of the matrix $Y_i$ determined in the measurement cycle i, the read-write control unit 4 controls the memory cells of the second memory 2 to be incremented in each case via the address line, reads out the memory content buffered in the respective memory cell of the second memory 2 to be incremented, increments the memory content, which has been read out, by the value "1" and stores the incremented memory content once again in the respective memory cells of the second memory 2.

The delaying unit 5 delays the information of the matrix $Y_i$, which was determined in measurement cycle i, regarding the memory cells of the first memory 1 to be incremented in measurement cycle i, by the number NofFrames of measurement cycles of an observation interval and routes these delayed items of information of the matrix $Y_i$, which represent the memory cells of the third memory 3 to be incremented in measurement cycle i, to the read-write control unit 6 in order to control the third memory 3.

Dependent upon the contents of the delayed matrix $Y_i$, the read-write control unit 6 controls the memory cells of the third memory 3 to be incremented in each case via the address line, reads out the memory contents buffered in the respective memory cell of the third memory 3 to be incremented, increments the memory content, which has been read out, by the value "1", and stores the incremented memory content once again in the respective memory cell of the third memory 3.

The memory contents of the memory cells in the third memory 3 adjacent to the read-write control unit 6 are subtracted from the memory contents of the corresponding memory cells in the second memory 2 adjacent to the read-write control unit 4 by the subtraction unit 7, in each case within the cycle of the number NofFramesNextCalc of measurement cycles, which occur in the delay time between two successive observation intervals, and buffered in the corresponding memory cell of the first memory 1 adjacent to the subtraction unit 7.

Since the values buffered in the individual memory cells of the first, second and third memory 1, 2 and 3 represent incremented counter statuses regarding the frequency of the signal levels of a measured signal detected within an observation interval at the individual values of the time or frequency raster and in the individual signal-level ranges, the word width of the individual memory cells should be set at the maximum frequency of occurrence of signal levels of the measured signal associated with the individual values of the time or frequency raster to be expected in one observation interval within the individual signal level ranges. Since a signal level of the measured signal associated with a given value of the time or frequency raster can occur a maximum of NofFrames times in one observation interval within one signal-level range, the word width of every memory cell in the first, second and third memory 1, 2 and 3 must be limited to 1d(NofFrames+1).

As an alternative to the delaying unit 5, the delaying of the information in the matrix $Y_i$ regarding the memory cells in the first memory 1 to be incremented in the measurement cycle i can be implemented in the third memory 3. For this purpose, the read-write control unit 6 implements the incrementations to be implemented in the measurement cycle i corresponding to the contents of the matrix $Y_i$ in the individual memory cells of the third memory 3 delayed by the number NofFrames measurement cycles occurring in one observation interval.

FIG. 4 illustrates an exemplary memory definition of the memory cells of the first, second and third memory 1, 2 and 3 with NofFrames=3 and NofFramesNextCalc=1 for several measurement cycles in time succession with word widths of the memory cells of 2.

The incrementations implemented in the individual measurement cycles i, which fluctuate from measurement cycle to measurement cycle because of the difference in the signal levels of the measured signal at the individual measurement points of the time or frequency raster, are evident in the memory cells of the second memory.

The incrementations delayed by a total of three measurement cycles relative to the incrementations of the memory cells in the second memory are evident in the memory cells in the third memory.

As can easily be comprehended, the memory cells of the first memory each contain the number of incrementations of the second memory determined respectively in the last three measurement cycles in total (that is to say, first memory (i=4)=second memory (i=1)+second memory (i=2)+second memory (i=3); first memory (i=5)=second memory (i=2)+second memory (i=3)+second memory (i=3); first memory (i=6)=second memory (i=3)+second memory (i=4)+second memory (i=5) and so on).

It is also evident that the method according to an embodiment of the invention and the device according to an embodiment of the invention require a transient time over the first three measurement cycles—i=0, 1, 2—, until correct values regarding the number of signal levels of the measured signal determined in one observation interval over a total of three measurement cycles are present within the individual signal-level ranges and at the individual values of the time frequency raster.

The invention is not restricted to the embodiment presented of the method according to the invention and the device according to the invention for determining the frequency distribution of the signal levels of a measured signal measured respectively in overlapping observation intervals. In particular, additionally-integrated methods and devices for minimizing the number of incrementations to be implemented in the individual memories with a sequence of memory cells to be incremented in a row or a column of the memory are also covered by the invention.

The invention claimed is:

1. A method for determining an occurrence distribution of a signal level of a measured signal measured respectively in overlapping observation intervals via a time or frequency raster, said method comprising:

determining incrementations of a memory cell in a first memory, said memory cell associated with a value of the time or frequency raster and the signal level of the measured signal;

determining a number of un-delayed incrementations of every memory cell of the first memory over the number of already measured observation intervals by summing the number of incrementations of every memory cell of the first memory determined in every already measured observation interval, each comprising several measurement cycles;

delaying the number of the un-delayed incrementations of every memory cell of the first memory over the number of already measured observation intervals by a delay time corresponding to a number of measurement cycles in the observation interval by a delay unit; and determining the occurrence distribution of the signal level of the measured signal in the observation intervals in the time or frequency raster by subtracting the number of delayed incrementations of every memory cell of the first memory over the number of already measured observation intervals from the number of un-delayed incrementations of every memory cell of the first memory over the number of already measured observation intervals within the raster of the number of measurement cycles.

2. The method according to claim 1, wherein the delayed incrementations are delayed by a given number of measurement cycles of each observation interval relative to the un-delayed incrementations.

3. The method according to claim 2, wherein, in order to subtract the delayed incrementations from the un-delayed incrementations, memory content of every memory cell of a third memory is subtracted from memory content of a corresponding memory cell of a second memory and is buffered in a corresponding memory cell of the first memory.

4. The method according to claim 3, wherein subtracting the delayed incrementations from the un-delayed incrementations is implemented within a cycle of a given number of measurement cycles, which occur in delay time between two successive observation intervals.

5. The method according to claim 1, wherein, in order to subtract the delayed incrementations from the un-delayed incrementations, memory content of every memory cell of a third memory is subtracted from memory content of a corresponding memory cell of a second memory and is buffered in a corresponding memory cell of the first memory.

6. The method according to claim 3, wherein subtracting the delayed incrementations from the un-delayed incrementations is implemented within a cycle of a given number of measurement cycles, which occur in delay time between two successive observation intervals.

7. A device for determining an occurrence distribution of a signal level of a measured signal measured respectively in overlapping observation intervals via a time or frequency raster, said device comprising:

a first, second and third memory, of which individual memory cells contain a number of signal levels of the measured signal measured in associated signal-level ranges and at associated values of the time or frequency raster, said memory cells being incremented respectively in measurement cycles of each observation interval, wherein the memory cells of the second memory contain an un-delayed number of measured signal levels of the measured signal over the number of already measured observation intervals, wherein the memory cells of the third memory contain respectively a delayed number of measured signal levels of the measured signal over the number of already measured observation intervals, and wherein the memory cells of the first memory contain a difference between the un-delayed and the delayed number of measured signal levels over the number of already measured observation intervals;

a delaying unit connected upstream of the third memory in order to delay the un-delayed number of measured signal levels of the measured signal over the number of already measured observation intervals by a delay time corresponding to the number of measurement cycles in the observation interval; and a subtraction unit connected downstream of the second and third memories and upstream of the first memory in order to subtract the delayed number of measured signal levels from the un-delayed number of measured signal levels so that the occurrence distribution of the signal level of the measured signal is determined in the observation intervals in the time or frequency raster.

8. The device according to claim 7, wherein, in each case, a read-write control unit, configured to control incrementation of the memory cells of the second memory and the third memory, is connected upstream of the second memory and the third memory.

* * * * *